United States Patent [19]
Sakai et al.

[11] Patent Number: 5,815,762
[45] Date of Patent: Sep. 29, 1998

[54] PROCESSING APPARATUS AND PROCESSING METHOD

[75] Inventors: Mitsuhiro Sakai; Masafumi Nomura, both of Kumamoto-ken; Kazuaki Tsunoda, Kumamoto, all of Japan

[73] Assignee: Tokyo Electron Limited, Tokyo, Japan

[21] Appl. No.: 878,960

[22] Filed: Jun. 19, 1997

[30] Foreign Application Priority Data

Jun. 21, 1996 [JP] Japan .................................. 8-181170

[51] Int. Cl.$^6$ .................................................. G03D 5/04
[52] U.S. Cl. ......................... 396/611; 396/627; 134/153; 134/199; 134/902
[58] Field of Search .................................. 396/611, 626, 396/627, 604; 134/902, 144, 148, 153, 151, 199

[56] References Cited

U.S. PATENT DOCUMENTS

| | | | |
|---|---|---|---|
| 4,755,844 | 7/1988 | Tsuchiya et al. ....................... | 396/611 |
| 4,922,277 | 5/1990 | Carlson et al. ......................... | 396/626 |
| 5,555,234 | 9/1996 | Sugimoto ............................... | 396/611 |
| 5,625,433 | 4/1997 | Inada et al. ............................ | 396/627 |
| 5,689,749 | 11/1997 | Tanaka et al. ......................... | 396/611 |

*Primary Examiner*—A. A. Mathews
*Attorney, Agent, or Firm*—Oblon, Spivak, McClelland, Maier & Neustadt, P.C.

[57] ABSTRACT

A development processing apparatus includes a processing unit for storing a substrate S and a processing solution supply nozzle arranged above the substrate S stored in the processing unit. A processing solution storage is formed inside the supply nozzle. A supply passage for supplying the processing solution into the solution storage is connected to the supply nozzle. A plurality of eject holes for ejecting the processing solution in the solution storage are formed in a lower surface of the supply nozzle. In this processing apparatus, the upper surface of the solution storage consists of at least one inclined surface, and an exhaust port is formed in a high portion of the inclined surface.

30 Claims, 10 Drawing Sheets

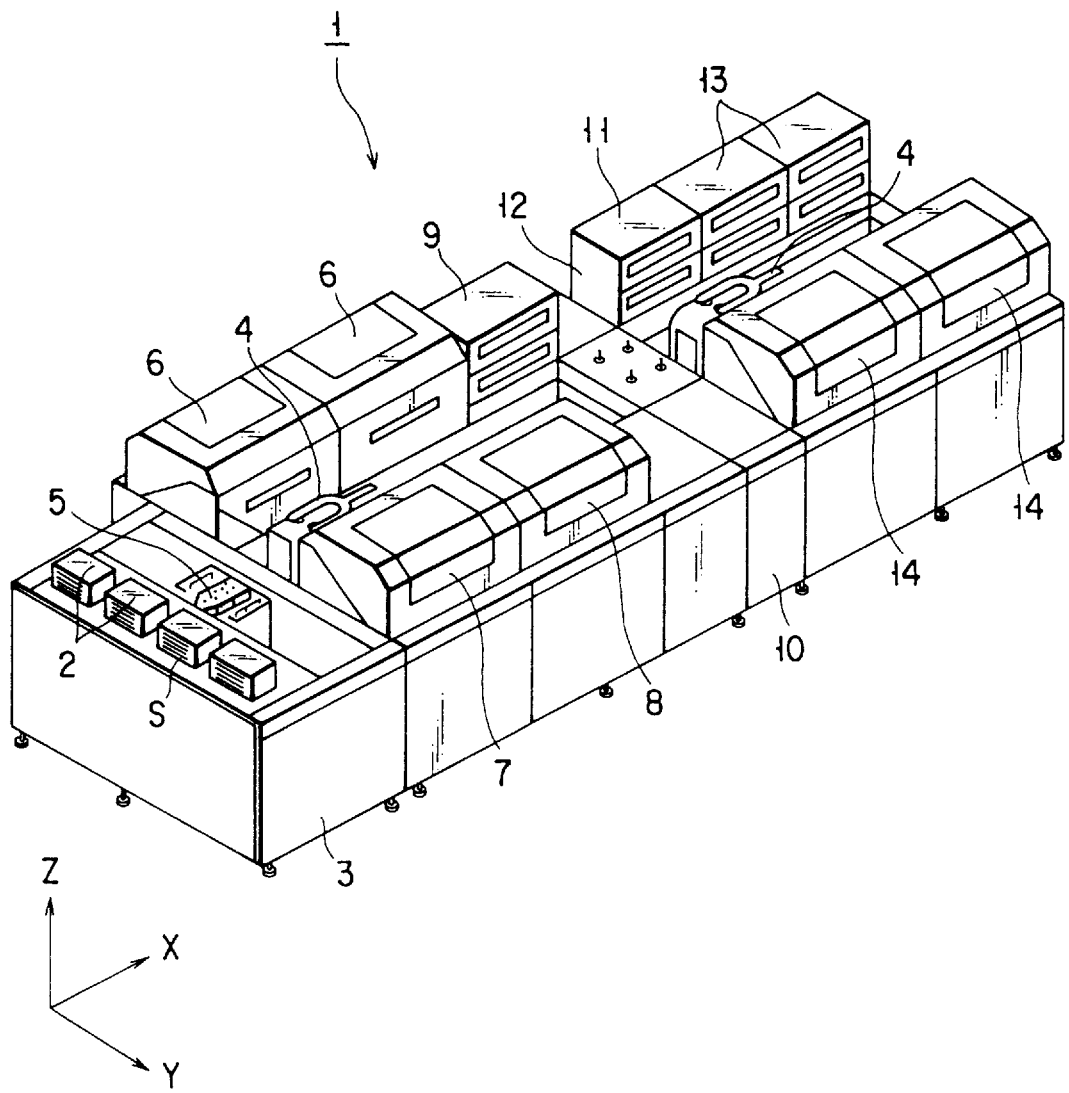
F I G. 1

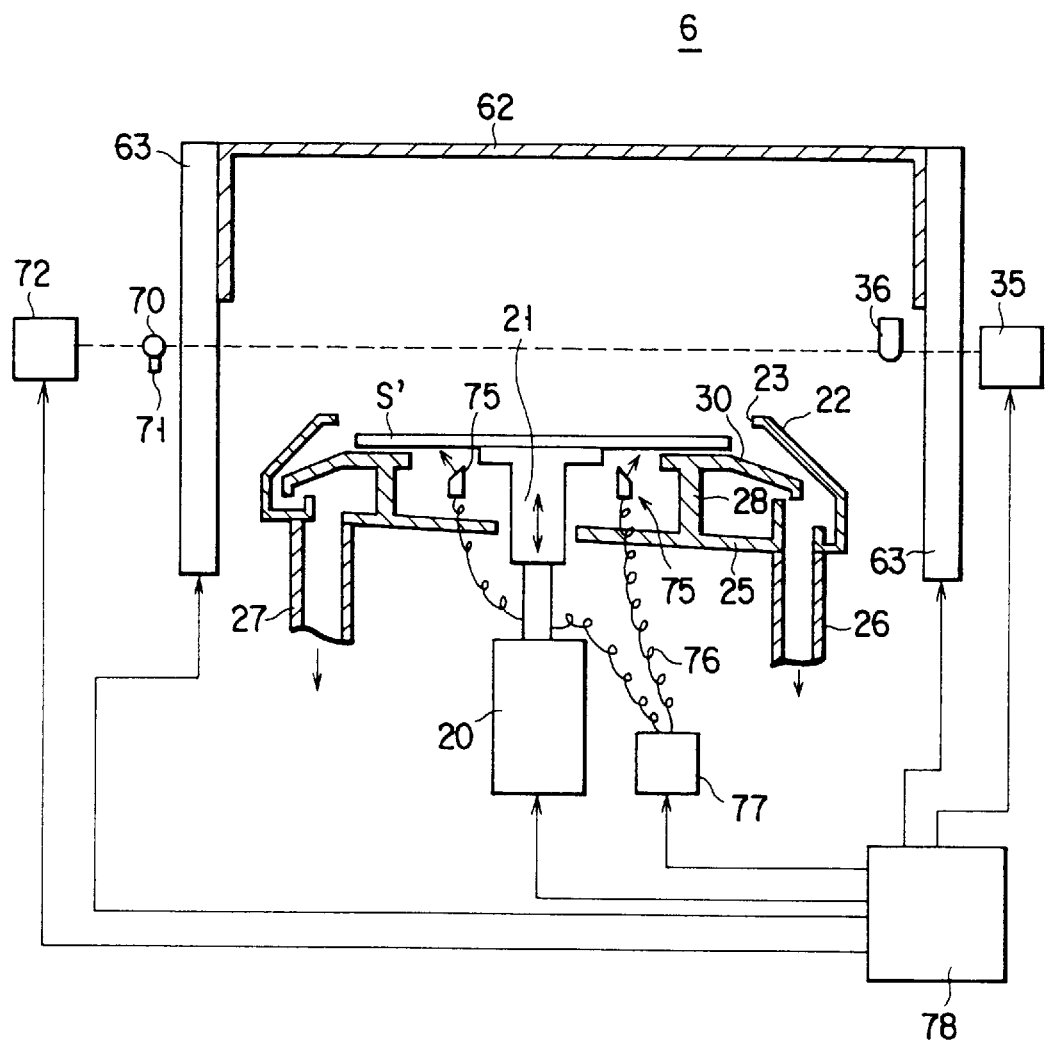
F I G. 2

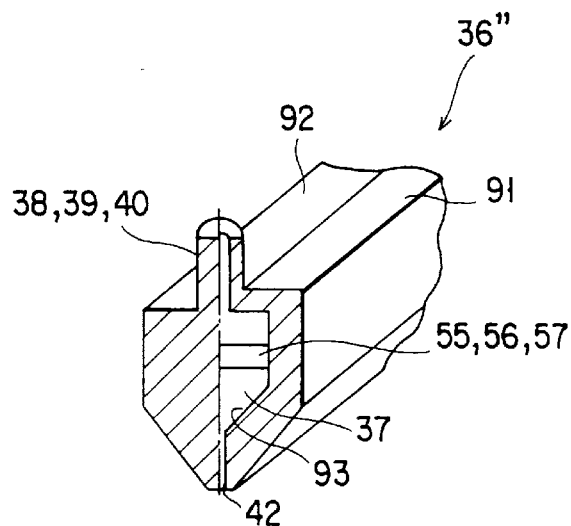
F I G. 12
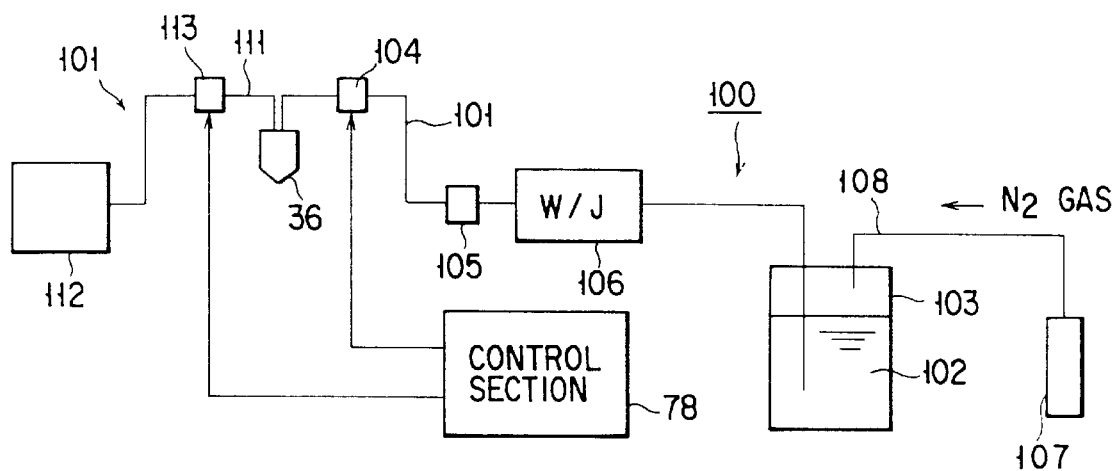
F I G. 14

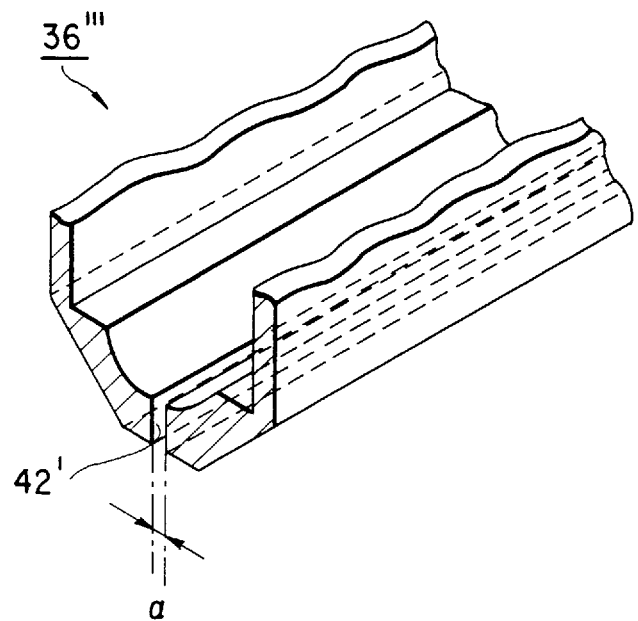
F I G. 13
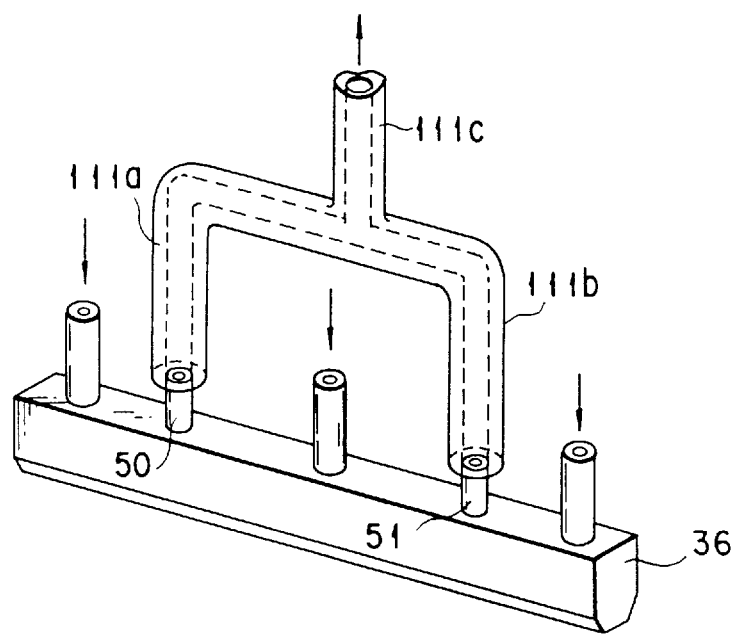
F I G. 15

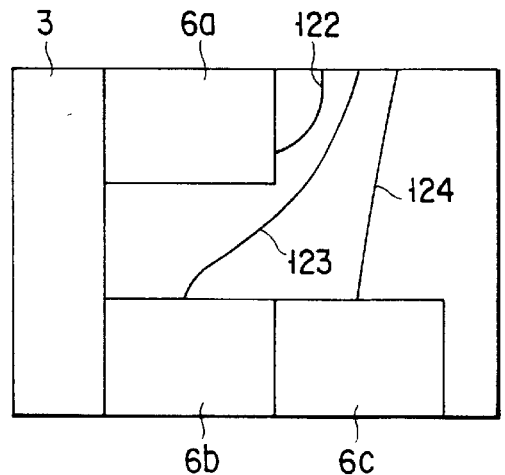
F I G. 19
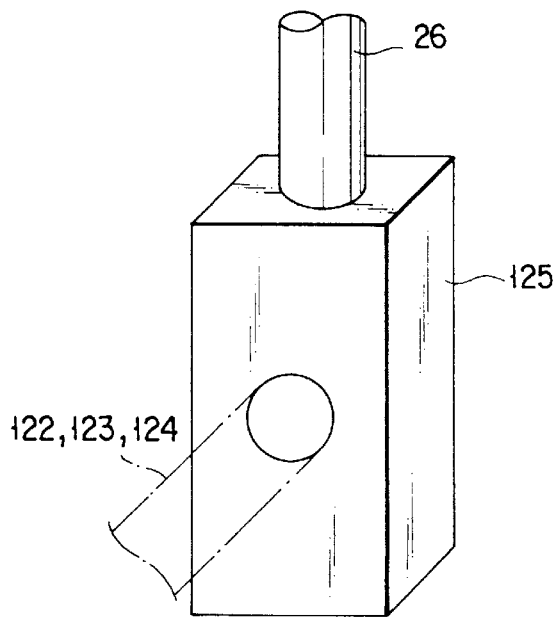
F I G. 21

PROCESSING APPARATUS AND PROCESSING METHOD

BACKGROUND OF THE INVENTION

The present invention relates to a processing apparatus and a processing method used in such as developing process for a substrate, e.g., an LCD substrate or a semiconductor wafer.

For example, in the fabrication of semiconductors, a so-called lithography step is performed to form a resist pattern on the surface of an object to be processed, e.g., a semiconductor wafer or an LCD substrate. This lithography step consists of various steps such as cleaning of an object to be processed, coating of a resist film onto the surface of the object, and exposure and development of the resist film.

In these processing steps, the step of developing a resist film is one of the steps which require the most precise control in the lithography processing. In developing a resist film, it is important to evenly supply a developing solution onto a substrate and uniformly develop a resist throughout the entire surface of the substrate. Conventionally known examples of the method of supplying a developing solution onto a substrate are a scanning method, a spin method, a dip method, and a spray method. In the scanning method, a supply nozzle having a large number of eject holes is scanned on a substrate placed on a table to supply a developing solution on the entire surface of the substrate. In the spin method, a substrate drawn on a spin chuck by suction is rotated to diffuse a developing solution by the centrifugal force. In the dip method, a substrate is dipped in a developing solution. In the spray method, a developing solution pressurized by, e.g., a pump is sprayed onto a substrate. After development is completed by supplying a developing solution by any of these methods, a substrate is rinsed with a rinsing solution.

When a developing solution is supplied to the surface of a substrate by the scanning method, air tends to gradually accumulate in a solution storage formed inside the nozzle. This occurs because a very small amount of air mixed in the developing solution gradually accumulates in the solution storage.

When air is left to accumulate in the solution storage inside the supply nozzle in this way, it becomes difficult to uniformly eject a sufficient amount of a developing solution from a large number of eject holes formed in the lower surface of the supply nozzle. When a developing solution is not sufficiently supplied to the surface of a substrate, development becomes insufficient to produce so-called development defects. Also, when the supply of a developing solution becomes nonuniform to form portions where the amounts of the developing solution are large and small on a resist film, uneven development takes place.

Furthermore, if a developing solution is kept supplied while air is accumulated in the solution storage inside the supply nozzle, air bubbles can mix in a developing solution supplied to the surface of a substrate. When air bubbles mix in the developing solution on the substrate surface, development cannot be well performed in that portion, producing so-called development defects.

BRIEF SUMMARY OF THE INVENTION

It is an object of the present invention to provide a processing apparatus and a processing method by which no air accumulates in a solution storage inside a supply nozzle.

According to the first aspect of the present invention, there is provided a processing apparatus comprising: a processing unit for containing a substrate; a processing solution supply nozzle arranged above the substrate; a processing solution storage formed inside the supply nozzle and having an upper surface consisting of at least one inclined surface; a supply passage for supplying a solution into the solution storage; a plurality of eject holes formed in a lower surface of the supply nozzle to eject the processing solution in the solution storage; and an exhaust port formed in a high portion of the inclined surface of the solution storage.

According to the second aspect of the present invention, there is provided a processing apparatus comprising: a processing unit for storing a substrate; a processing solution supply nozzle arranged above the substrate; a processing solution storage formed inside the supply nozzle; a supply passage for supplying a processing solution into the solution storage; a plurality of eject holes formed in a lower surface of the supply nozzle to eject the processing solution in the solution storage; an exhaust port for exhausting air from the solution storage to the outside; and a guide member for dispersing a flow of the processing solution supplied from the supply passage into the solution storage.

According to the third aspect of the present invention, there is provided a processing method of processing a substrate by supplying a processing solution to a surface of the substrate, comprising the steps of: supplying the processing solution to a solution storage formed in a supply nozzle and ejecting the processing solution in the solution storage from a plurality of eject holes formed in a lower surface of the supply nozzle, thereby supplying the processing solution on a surface of a substrate; and exhausting air from the solution storage through an exhaust port formed in the supply nozzle.

In the present invention, a developing solution containing no air bubbles can be evenly supplied to the entire surface of a substrate. The result is an effect of significantly suppressing formation of defects during development. The present invention can maintain the uniformity of development and provide high-quality products. Also, since it is unnecessary to supply a larger amount of a developing solution than is needed, the running cost can be reduced, and this improves the economical efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing the whole arrangement of a processing system in which a developing apparatus is installed;

FIG. 2 is a sectional view of the developing apparatus according to an embodiment of the present invention;

FIG. 12 is a sectional view showing another modification of the developing solution supply nozzle;

FIG. 13 is a partially perspective sectional view showing the main part of the modification of the developing solution supply nozzle of the present invention;

FIG. 14 is a schematic view showing a developing solution supply system and an exhaust system for the developing solution supply nozzle;

FIG. 15 is a perspective view of a modification of the developing solution supply nozzle;

FIG. 19 is a view for explaining an improved drain line in the resist processing system;

FIG. 21 is a perspective view of an improved manifold in the resist processing system.

DETAILED DESCRIPTION OF THE INVENTION

Figure 3:
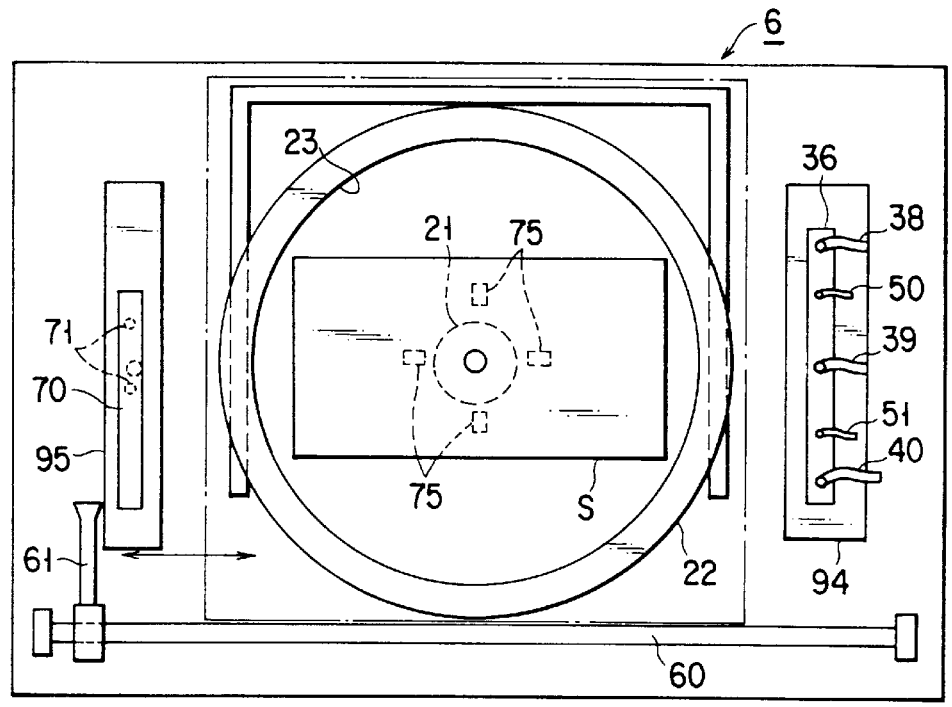
FIG. 3 is a plan view of the developing apparatus according to the embodiment of the present invention.

A preferred embodiment of the present invention will be described in detail below with reference to the accompanying drawing.

A resist processing system 1 shown in FIG. 1 includes a cassette station 3 on one end portion. On this cassette station 3, a plurality of cassettes 2 containing LCD substrates S (to be referred to as "substrates S" hereinafter) are placed. An auxiliary arm 5 is disposed in front of the cassettes 2 on the cassette station 3. This auxiliary arm 5 transfers and positions the substrate S and also holds and exchanges the substrate S with a main arm 4. Two such main arms 4 are arranged in series so as to be movable along the longitudinal direction in a central portion of the processing system 1. On two sides of the transfer path, developing apparatuses 6 and other various processing apparatuses are arranged.

In this processing system 1 shown in FIG. 1, a brush scrubber 7 and a high-pressure jet cleaner 8 are juxtaposed next to the cassette station 3. The brush scrubber 7 cleans the substrate S with a brush, and the high-pressure jet cleaner 8 cleans the substrate S with high-pressure jet water. Two developing apparatuses 6 are juxtaposed on the other side of the transfer path of the main arm 4. Two heating apparatuses 9 are stacked next to the developing apparatuses 6.

An adhesion apparatus 11 is arranged next to these apparatuses via a connection interface unit 10. This adhesion apparatus 11 makes the substrate S hydrophobic before the substrate S is coated with a resist film. A cooling apparatus 12 is arranged below the adhesion apparatus 11. Two sets of two stacked heating apparatuses 13 are arranged next to the adhesion apparatus 11 and the cooling apparatus 12. Two resist film coating apparatuses 14 are juxtaposed on the other side of the transfer path of the main arm 4. Each resist film coating apparatus 14 coats the substrate S with a resist solution to form a resist film (photosensitive film) on the surface of the substrate S. Although not shown, an exposure apparatus for exposing a predetermined fine pattern on the resist film formed on the substrate S is arranged on the side of these resist film coating apparatuses.

Each main arm 4 includes X-, Y-, and Z-axis driving mechanisms (the directions of X, Y, and Z axes are shown in FIG. 1), and also includes a θ rotating mechanism which rotates about the Z axis. These main arms 4 with this construction appropriately run along the central path of the resist processing system 1 and transfer the substrates S between the processing apparatuses 6, 9, and 11 to 13. The main arms 4 load unprocessed substrates S into the processing apparatuses 6, 9, and 11 to 13 and unload processed substrates S from the processing apparatuses 6, 9, and 11 to 13.

As shown in FIG. 2 and 3, a spin chuck 21 which is rotatable and vertically movable by a driving motor 20 is provided in a central portion of each developing apparatus 6 incorporated into the processing system 1 with the above arrangement. The substrate S is horizontally drawn by suction, e.g., vacuum suction, and held on the upper surface of this spin drawn. A resin or metal annular cup 22 for preventing scattering of a developing or rinsing solution is so formed as to surround the spin chuck 21. This cup 22 is inclined inward so that the cup 22 is narrowed upward. An upper end opening 23 of the cup 22 has a diameter which allows the substrate S in a horizontal state to move down into the cup 22. A bottom surface 25 of the cup 22 is slightly inclined with respect to the horizontal direction. A solution discharge pipe 26 is connected to the lowest portion of the bottom surface 22, and an exhaust pipe 27 for exhausting the atmosphere from the cup 22 is connected to the other side of the cup 22. An annular wall 28 whose diameter is smaller than that of the substrate S extends upward from the bottom surface 25. A straightening plate 30 is disposed on the upper end of the annular wall 28. This straightening plate 30 is close to the lower surface of the substrate S which is drawn by suction and held by the spin chuck 21. The outer peripheral portion of the straightening plate 30 is inclined downward.

Figure 4:
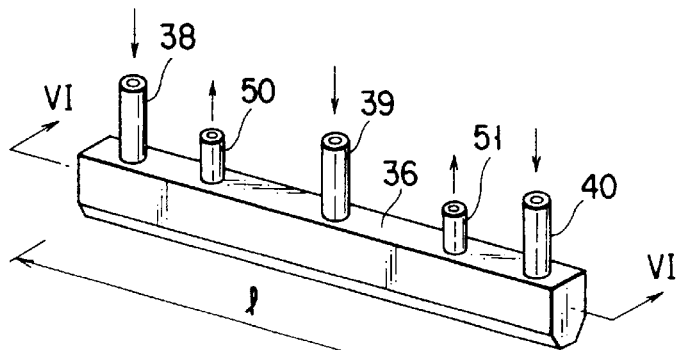
FIG. 4 is a perspective view of a developing solution supply nozzle.
Figure 5:
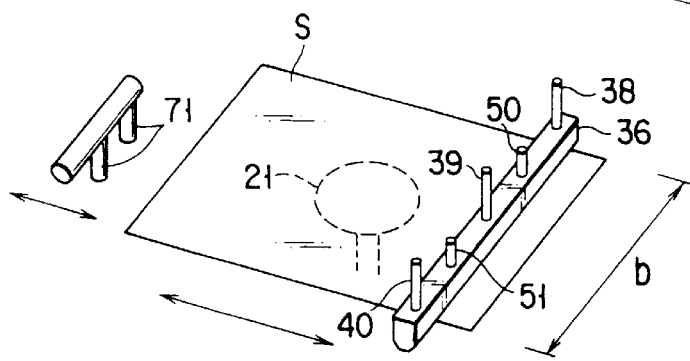
FIG. 5 is a view for explaining the operation of the developing solution supply nozzle.

A developing solution supply device 35 for supplying a developing solution onto the substrate S is disposed at the upper right position of the cup 22. As shown in FIGS. 4 and 5, this developing solution supply device 35 has a developing solution supply nozzle 36 having a length L slightly larger than a width b of the substrate S.

Figures 6, 7:
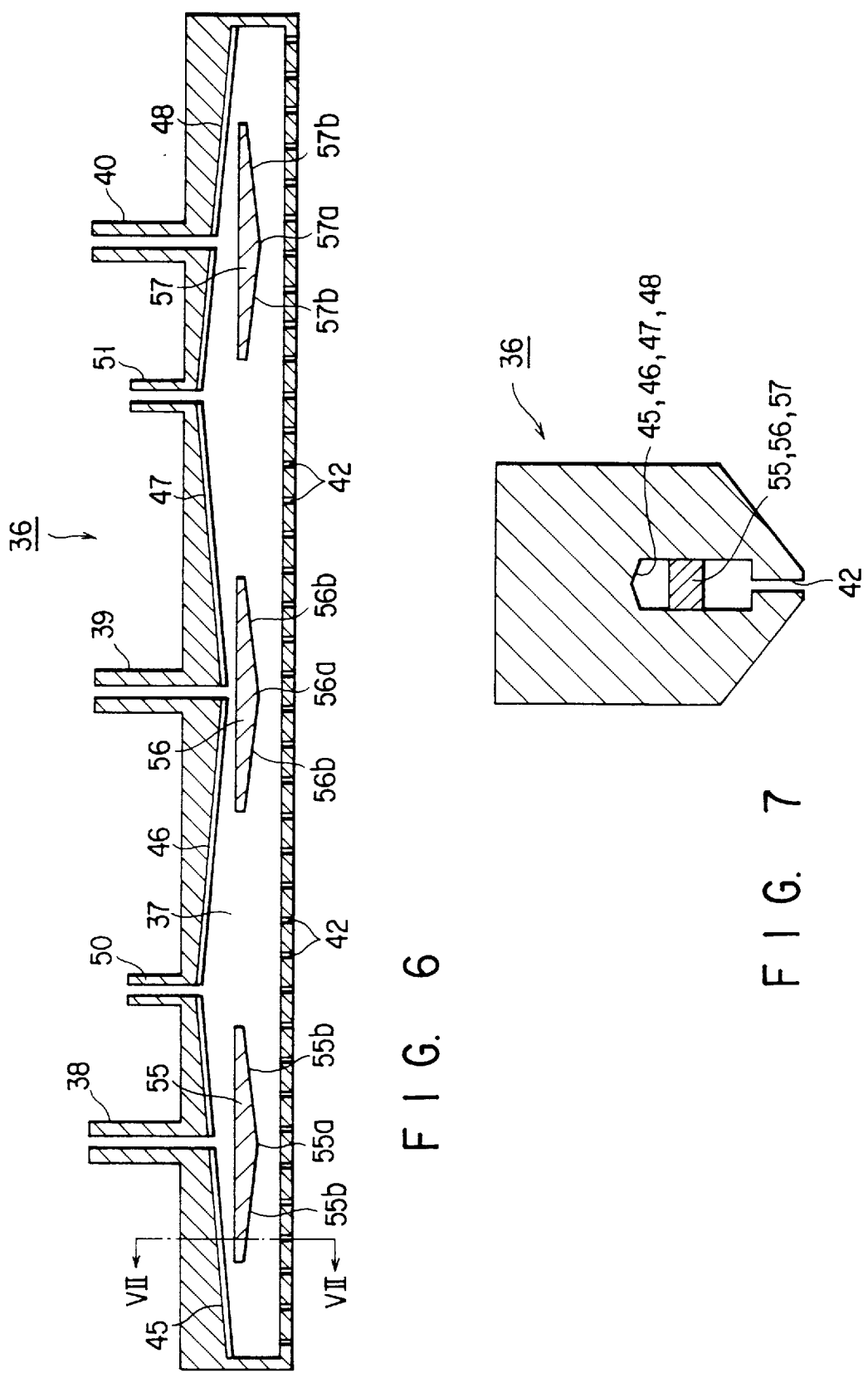
FIG. 6 is an enlarged sectional view taken along a line VI—VI in FIG. 4.
FIG. 7 is an enlarged sectional view taken along a line VII—VII in FIG. 6.

As shown in FIG. 6, a solution storage 37 for a developing solution is formed inside the developing solution supply nozzle 36. A developing solution is supplied to this solution storage 37 through three supply passages 38, 39, and 40 connected to the left, center, and right portions of the upper surface of the developing solution supply nozzle 36. A large number of eject holes 42 for ejecting the developing solution stored in this solution storage 37 are formed in the lower surface of the developing solution supply nozzle 36 across the full width of the supply nozzle 36.

In the embodiment shown in FIG. 6, the upper surface of the solution storage 37 consists of four inclined surfaces 45, 46, 47, and 48. Referring to FIG. 6, the surfaces 45 and 47 are inclined upward to the right, and the surfaces 46 and 48 are inclined upward to the left. The supply passage 38 is open in the middle of the inclined surface 45, and the supply passage 40 is open in the middle of the inclined surface 48. The supply passage 39 is open between the lowest portions of the inclined surfaces 46 and 47.

An exhaust port 50 is opened in a portion between the highest portions of the inclined surfaces 45 and 46, and an exhaust port 51 is opened in a portion between the highest portions of the inclined surfaces 47 and 48. In other words, the exhaust port 50 is formed at the vertex of a triangle having the inclined surfaces 45 and 46 as two adjacent sides. Analogously, the exhaust port 51 is formed at the vertex of a triangle having the inclined surfaces 47 and 48 as two adjacent sides. In the inclined surfaces 45, 46, 47, and 48, a "high portion of an inclined surface" is a position higher than the lower end portion in the direction of inclination of these inclined surfaces, and preferably a position near the upper end portion of each of the inclined surfaces 45, 46, 47, and 48.

As described above, the upper surface of the solution storage 37 of the developing solution supply nozzle 36 shown in FIG. 6 is constituted by the inclined surfaces 45 to 48. Therefore, when air accumulates in the solution storage 37, this air can be floated along the inclined surfaces 45 to 48 and moved to the high portions of the inclined surfaces 45 to 48. The air thus moved to the high portions of the inclined surfaces 45 to 48 is exhausted from the exhaust ports 50 and 51 to the outside of the supply nozzle 36. In this manner, the air accumulated in the solution storage 37 of the supply nozzle 36 can be removed.

To facilitate floating the air in the solution storage 37, the inclined surfaces 45, 46, 47, and 48 have an inverted V sectional shape as shown in FIG. 7.

In the solution storage 37, guide members 55, 56, and 57 are arranged below the opening positions of the supply passages 38, 39, and 40, respectively. These guide members 55, 56, and 57 prevent the flow of a developing solution supplied from the supply passages 38, 39, and 40 into the solution storage 37 from becoming straight toward the eject holes 42 in the lower surface of the supply nozzle 36. Since the guide members 55, 56, and 57 are thus arranged below the opening positions of the supply passages 38, 39, and 40, the force of a developing solution flowing from the supply passages 38, 39, and 40 into the solution storage 37 is stopped, and the flow is dispersed. Consequently, the developing solution can be evenly ejected from the eject holes 42 in the lower surface of the supply nozzle 36.

In the embodiment shown in FIG. 6, the lower surface of each of these guide members 55, 56, and 57 is an inclined surface with a low central portion and two high end portions. In the case of the guide member 55, for example, a lower surface central portion 55a is the lowest portion, and inclined surfaces 55b which gradually become higher toward the end portions are formed on the two sides of the lower surface central portion 55a. Analogously, in the other guide members 56 and 57, lower surface central portions 56a and 57a are the lowest portions, and similar inclined surfaces 56b and 57b are formed on the two sides of the lower surface central portions 56a and 57a. "The lower surfaces of the guide members 55, 56, and 57 are high or low" means that the lower surfaces are away from or close to the eject holes 42.

Since the lower surfaces of the guide members 55, 56, and 57 are constituted by the inclined surfaces 55b, 56b, and 57b, air existing near the lower surfaces of these guide members 55, 56, and 57 can be floated along the inclined surfaces 55b, 56b, and 57b. The air thus floated further floats in the solution storage 37 along the inclined surfaces 45 to 48, moves to the high portions of the inclined surfaces 45 to 48, and is exhausted from the exhaust ports 50 and 51 to the outside of the supply nozzle 36.

Figure 8:
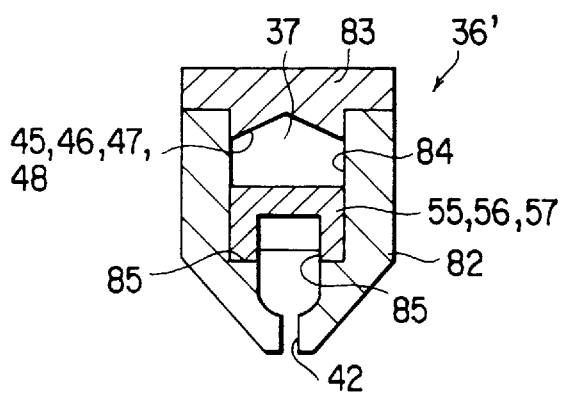
FIG. 8 is a sectional view showing a modification of the developing solution supply nozzle.
Figure 10:
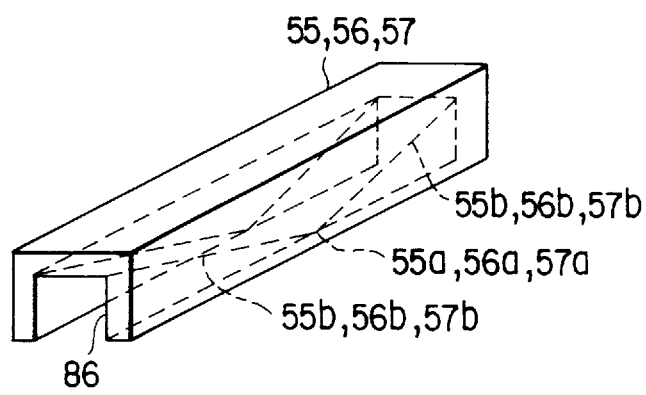
FIG. 10 is a perspective view showing a guide member of the developing solution supply nozzle shown in FIG. 8.
Figure 9:
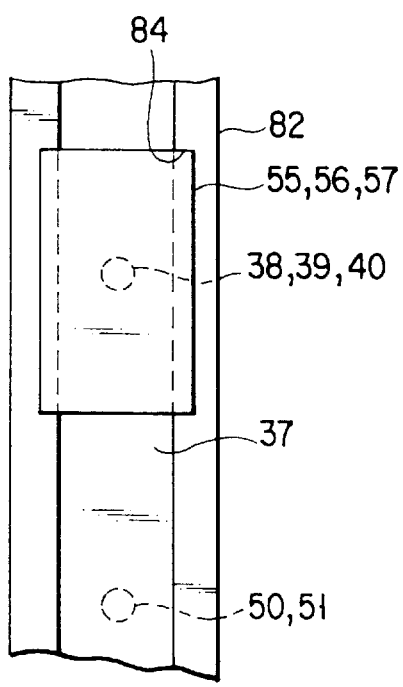
FIG. 9 is a plan view showing the main part of the modification of the developing solution supply nozzle.
Figure 11:
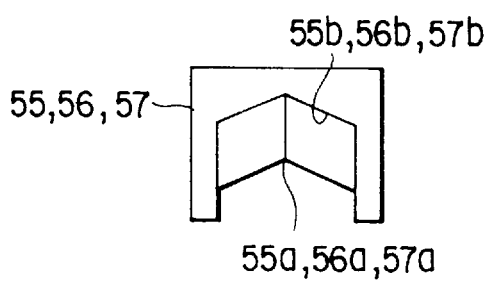
FIG. 11 is a front view showing a modification of the guide member shown in FIG. 10.

FIG. 8 is a sectional view showing a modification of the supply nozzle 36. A supply nozzle 36' according to this modification comprises a supply nozzle main body 82 and a cover member 83. The supply nozzle main body 82 has an internal solution storage 37 which has an open upper end portion. The cover member 83 covers this open upper end portion of the solution storage 37. Inclined surfaces 45, 46, 47, and 48 similar to those shown in FIG. 6 are formed on the inner surface of the cover member 83. As shown in FIG. 9, clearance portions 84 for fitting guide members 55, 56, and 57 are formed in the supply nozzle main body 82. As shown in FIG. 8, these clearance portions 84 have locking portions 85 for locking the two lower edges of the guide members 55, 56, and 57 shown in FIG. 10. In this embodiment, as shown in FIG. 10, recessed portions 86 for forming inclined surfaces 55b, 56b, and 57b are formed in the lower surfaces of the guide members 55, 56, and 57. Also, as shown in FIG. 11, to facilitate floating of air, the inclined surfaces 55b, 56b, and 57b of the guide members 55, 56, and 57 can be formed to have an inverted V shape.

FIG. 12 is a perspective view showing another modification of the supply nozzle 36. A supply nozzle 36" according to this modification consists of two vertically split blocks 91 and 92. In one block 91, a solution storage 37, supply passages 38, 39, and 40, and a recessed portion 93 for forming eject holes 42 are formed. Therefore, when the two blocks 91 and 92 are assembled, the solution storage 37, the supply passages 38, 39, and 40, and the eject holes 42 are defined by the recessed portion 93 and the wall surface of the block 92.

As shown in FIGS. 7, 8, and 12, the shower head type supply nozzle 36 having the plurality of eject holes 42 has been described. The supply nozzle, however, may be a slit type supply nozzle 36''', as shown in FIG. 13. This supply nozzle 36''' has a slit 42' continuously formed along its longitudinal direction. The slit 42' is formed to have a width of, e.g., several $\mu$m to several ten $\mu$m. The developing solution is so ejected as to ooze through the slit 42'. This slit type supply nozzle 36''' is better than the shower type supply nozzle in facilitating the manufacture.

As shown in FIG. 14, the supply nozzle 36 is connected to a developing solution supply system 100 and an exhaust system 110. The supply passages 38, 39, and 40 of the supply nozzle 36 are connected to one end portion of a developing solution supply pipe 101. The other end of the developing solution supply pipe 101 extends into a developing solution tank 103 containing a developing solution 102 so that the end portion of the pipe is dipped into the developing solution 102. Along the developing solution supply pipe 101, a valve 104, a flow meter 105, and a water jacket 106 are disposed in this order from the supply nozzle 36. The developing solution tank 103 is connected to a pressure gas supply pipe 108 for supplying a pressure gas, e.g., $N_2$ gas from a gas source 107. In this developing solution supply system 100, $N_2$ gas is blown from the gas source 107 into the developing solution tank 103 containing the developing solution 102 through the pressure gas supply pipe 108, thereby pressurizing the developing solution 102 to 1 to 2 kg/cm². The developing solution 102 is supplied by this pressure to the developing solution supply nozzle 36 through the developing solution supply pipe 101 and ejected from the eject holes 42 formed in the developing solution supply nozzle 36. The water jacket (W/J) 106 disposed in the developing solution supply pipe 101 controls the temperature of the developing solution. The start and stop of the ejection of the developing solution are done by the valve 104.

The exhaust ports 50 and 51 of the developing solution supply nozzle 36 are connected to one end portion of the exhaust pipe 111. The other end of the exhaust pipe 111 is connected to a suction pump 112. A valve 113 is disposed in the exhaust pipe 111. In this exhaust system 110, air in the developing solution supply nozzle 36 is drawn by suction through the exhaust ports 50 and 51 and the exhaust pipe 111. The start and stop of this suction are done by the valve 113.

As shown in FIG. 15, exhaust pipes 111a and 111b respectively connected to the exhaust ports 50 and 51 of the developing solution supply nozzle 36 preferably merge into an exhaust pipe main body 111c which is then connected to a suction pump 112. In moving the supply nozzle 36 on the substrate S while gripping the supply nozzle 36 with a gripping arm 61, the exhaust pipes 111a and 111b merge near the supply nozzle 36, and only one exhaust pipe main body 111c is attached with the gripping arm 61, thereby reducing the attaching space and facilitating the attaching operation of the exhaust pipes.

As shown in FIG. 3, a transfer rail 60 for moving the developing solution supply nozzle 36 from side to side above the substrate S is provided in front of the cup 22 in the developing apparatus 6. A gripping arm is fitted on this rail 60 so as to be movable along the rail 60. The gripping arm 61 is moved by a ball screw driven by, e.g., an air cylinder or a stepping motor, or by a belt-type moving mechanism. The gripping arm 61 is thus moved back and forth above the substrate S while gripping the developing solution supply nozzle 36 described previously. Note that the gripping arm 61 is constituted by a mechanical chuck mechanism using, e.g., an air cylinder, a vacuum suction type chuck, or an electromagnetic type chuck, and can grip, clamp, and draw the developing solution supply nozzle 36 by suction.

As shown in FIG. 3, a drain tray 94 is provided in the home position of the developing solution nozzle 36. The drain tray 94 receives a developing solution ejected when dummy dispensing (to be described later) is performed or receives a developing solution dripping from the developing solution supply nozzle 36 and discharges the developing solution to a solution discharge system (not shown).

As shown in FIG. 2, a rinsing solution supply nozzle 70 for supplying, e.g., pure water, as a rinsing solution, is provided on the side of the spin chuck 21 away from the developing solution supply nozzle 36. As shown in FIG. 5, two nozzle main bodies 71 extend downward from the rinsing solution supply nozzle 70. Similar to the developing solution supply nozzle 36 described above, this rinsing solution supply nozzle 70 is also gripped by the gripping arm 61 provided on the transfer rail 60 and moved back and forth above the substrate S. After development, a rinsing solution is supplied from a rinsing solution supply device 72 shown in FIG. 2. The rinsing solution supply nozzle 70 supplies this rinsing solution onto the substrate S by ejecting the solution from the nozzle main bodies 71, thereby rinsing the substrate S.

As shown in FIG. 3, a drain tray 95 is provided in the home position of the rinsing solution supply nozzle 70. The drain tray 95 receives a developing solution dripping from the rinsing solution supply nozzle 70 and discharges the developing solution to a solution discharge system (not shown).

Also, as shown in FIGS. 2 and 3, cleaning water spray nozzles 75 for spraying cleaning water against the lower surface of the substrate S are formed below the substrate S held by the spin chuck 21. Cleaning water can be supplied from a cleaning water source 77 to the cleaning water spray nozzles 75 through cleaning water supply pipes 76.

Furthermore, as shown in FIGS. 2 and 3, a cover 62 is provided above the spin chuck 21 so as to be vertically movable by an elevating means 63 such as an air cylinder. When moved down to the lowest position, the cover 62 surrounds the upper portion of the spin chuck 21 and the outer circumference of the cup 22 and prevents scattering of a developing solution or a rinsing solution to the outside when the substrate S is rotated by the spin chuck 21.

A control section 78 such as a microcomputer controls the whole developing apparatus 6 including the driving motor 20, the developing solution supply device 35, the elevating means 63, the rinsing solution supply device 72, the cleaning water source 77, and the valves 104 and 113.

The operation of the whole system with the above construction will be described below. The substrate S is unloaded from the cassette 2 on the carrier station 3 shown in FIG. 1, transferred to the main arm 4, and loaded into the brush scrubber 7. The substrate S is cleaned with a brush in this brush scrubber 7 and subsequently dried. The substrate S can also be cleaned with high-pressure jet water in the high-pressure jet cleaner 8 in accordance with the process. Thereafter, the substrate S is given hydrophobic properties in the adhesion apparatus 11 and cooled by the cooling apparatus 12. The surface of the substrate S is then coated with a resist film, i.e., a photosensitive film, by the resist coating apparatus 14. The resist film is subjected to baking processing by heating in the heating apparatus 9, and a predetermined pattern is exposed in the exposing apparatus (not shown). The exposed substrate S is loaded into the developing apparatus 6 according to the embodiment of the present invention.

Development performed in the developing apparatus 6 will be described with reference to a flow chart in FIG. 16.

Figure 16:
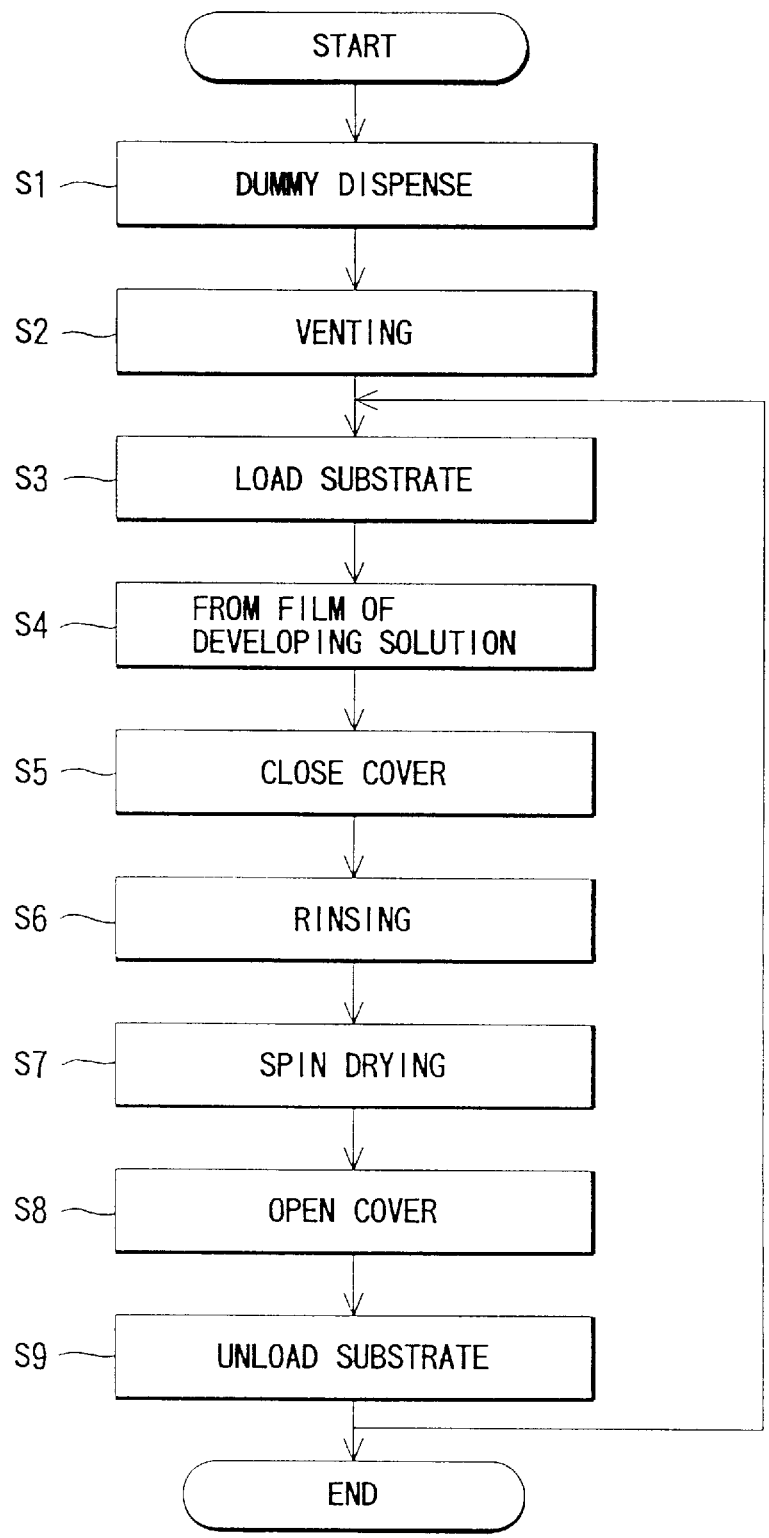
FIG. 16 is a flow chart showing the flow of a development method according to the present invention.

Prior to performing development for one lot, i.e., a plurality of, e.g., 20 substrates S stored in one carrier, a predetermined amount of developing solution is ejected from the developing solution supply nozzle 36 in the home position, thereby performing so-called dummy dispensing (S1 in FIG. 16). This dummy dispensing prevents from occurring a non-uniformity of temperature of the developing solution and a degradation of the developing solution. Further, the dummy dispensing prevents that the nozzle 36 is choked up with the air bubbles.

Subsequently, venting is performed for the solution storage 37 in the developing solution supply nozzle 36 for 2 to 3 sec by the exhaust system 110 (S2 in FIG. 16). Consequently, air in the solution storage 37 is exhausted to the outside before the work is begun.

The substrate S is loaded into the developing apparatus 6 (S3 in FIG. 16). More specifically, in the developing apparatus 6, the spin chuck 21 ascends to receive the substrate S from the main arm 4 and descends while holding the substrate S by suction. In this manner the substrate S held by suction by the spin chuck 21 is placed in the cup 22.

Subsequently, a developing solution is supplied onto the surface of the substrate S to form a film of the developing solution (S4 in FIG. 16). More specifically, the gripping arm 61 explained in FIG. 3 grips and moves the developing solution supply nozzle 36 back and forth above the substrate S. The developing solution is ejected from the eject holes 42 formed in the lower surface of the developing solution supply nozzle 36 to form a film of the developing solution on the surface of the substrate S. The developing solution supply nozzle 36 can be moved back and forth only once or a plurality of times.

In this processing, the developing solution supplied from the developing solution supply device 35 (shown in FIG. 2) once enters the solution storage 37 through the supply passages 38, 39, and 40 and is stored in the solution storage 37. Thereafter, the developing solution is evenly ejected from a large number of small eject holes 42. Since the developing solution is once stored in the solution storage 37 before being ejected from the eject holes 42, the developing solution can be evenly ejected from the entire lower surface of the developing solution supply nozzle 36 having the length l slightly larger than the width b of the substrate S as shown in FIGS. 4 and 5. When this developing solution supply nozzle 36 is gripped and moved back and forth above the substrate S by the gripping arm 61, a uniform film of the developing solution can be formed on the entire surface of the substrate S.

As previously explained with reference to FIG. 6, the guide members 55, 56, and 57 are formed below the opening positions of the supply passages 38, 39, and 40 in the solution storage 37. Accordingly, the flow of the developing solution flowing from the supply passages 38, 39, and 40 into the solution storage 37 can be dispersed. Consequently, the developing solution can be evenly ejected more reliably from all the eject holes 42 of the developing solution supply nozzle 36.

Bubbles formed in the solution storage 37 of the developing solution supply device 35 or bubbles contained in the developing solution float along the inclined surfaces 45 to 48 as the upper surface of the solution storage 37 and move to high portions. These bubbles are exhausted from the exhaust ports 50 and 51 to the outside of the supply nozzle 36 by the exhaust system shown in FIG. 13. This allows the eject holes 42 to eject a developing solution containing little air bubbles and hence prevents defective development. Analogously, the inclined surfaces 55b, 56b, and 57b are formed as the lower surfaces of the guide members 55, 56, and 57. Therefore, air present near the lower surfaces of the guide members 55, 56, and 57 can also be floated in the solution storage 37 and exhausted from the exhaust ports 50 and 61 formed in high portions of the inclined surfaces 45 to 48 to the outside of the developing solution supply nozzle 36 through the exhaust pipe 111.

Since the uniform developing solution film is thus formed on the surface of the substrate S, high-quality development with few defects is complete. Usually, in supplying a developing solution to the substrate S, such as an LCD substrate, having a comparatively large area, the scan speed of the developing solution supply nozzle 36 must be maintained at a high speed in order to prevent uneven development. When the scan speed of the developing solution supply nozzle 36 is high, it is necessary to increase the supply amount of developing solution to supply a sufficient amount of developing solution onto the substrate S. Accordingly, the developing solution is usually supplied to the developing solution supply nozzle 36 at a relatively high supply pressure of, e.g., 1 to 2 kg/cm$^2$. At this high supply pressure, formation of bubbles in the developing solution is unavoidable. This tendency is becoming more and more conspicuous with the recent increase in the size of LCD substrates. The developing apparatus 6 of the present invention can perform development with few defects even in this current and future situations where the supply pressure of a developing solution cannot be lowered.

In this embodiment, the exhaust system 110 is connected to the exhaust ports 50 and 51 of the developing solution supply nozzle 36 to forcedly exhaust air from the solution storage 37. However, it is also possible to simply open the exhaust ports 50 and 51 to the surrounding ambient and naturally exhaust air from the solution storage 37 to the outside.

Subsequently, the elevating means 63 is operated to move the cover 62 downward to cover the upper portion of the spin chuck 21 and the outer circumference of the cup 22 (S5 in FIG. 16).

Thereafter, the substrate S is rinsed (S6 in FIG. 16). More specifically, the driving motor 20 is operated to rotate the spin chuck 21 and the substrate S. The developing solution on the substrate S is spun away by the centrifugal force. Simultaneously, the rinsing solution supply nozzle 70 moves to the rotational center of the substrate S and supplies a rinsing solution such as pure water from the nozzle main bodies 71 onto the central portion of the substrate S, thereby washing away the residual developing solution and the like. At the same time, the rinsing solution is supplied, cleaning water is sprayed toward the lower surface of the substrate S from the cleaning water spray nozzles 75 arranged below to the substrate S. This cleaning water washes away the developing solution and the like which cause particles adhering to the lower surface of the substrate S. On the other hand, the waste solution thus spun away by the centrifugal force is received by the inner surface of the cup 22, flows along the inclination of the bottom surface 25, and is discharged from the solution discharge pipe 26. The ambient containing mist in the cup 22 is evacuated through the solution discharge pipe 26 and discharged to the outside of the system via a mist trap (not shown).

Additionally, while the supply of the rinsing solution is stopped, the substrate S is rotated and spin-dried (S7 in FIG. 16).

When the rinsing and spin drying are complete, the cover 62 is moved upward by the elevating means 63 (S8 in FIG. 16). The processed substrate S is stored in the cassette 2 on the carrier station 3, unloaded, and transferred to the next processing step (S9 in FIG. 16).

The operations in steps S3 to S9 described above are repeatedly executed for all substrates S. After the operations in steps S3 to S9 are repeatedly performed for one lot of the substrates S, dummy dispensing in step S1 and venting in step S2 are performed before the operations are performed for the next lot.

Figure 17:
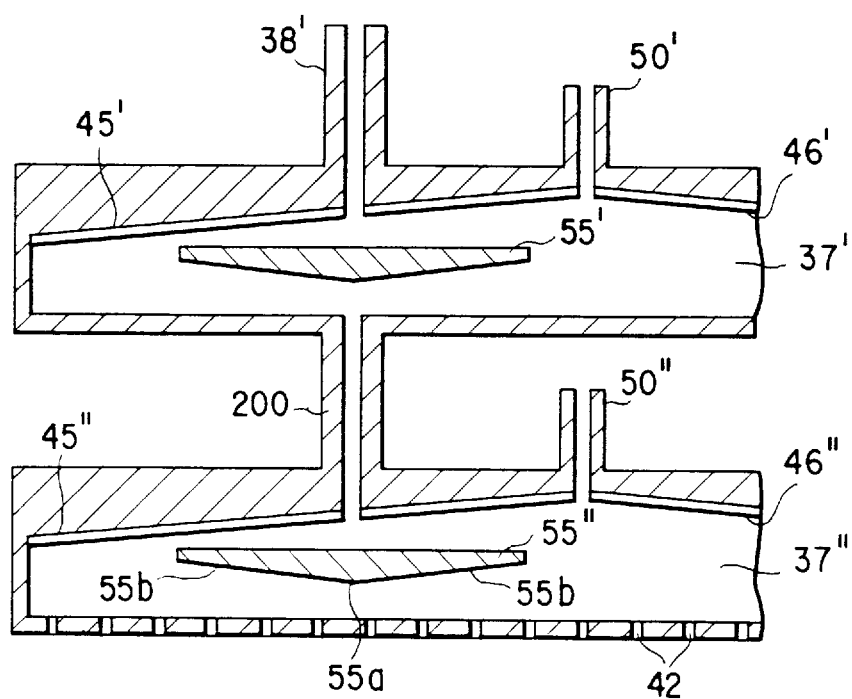
FIG. 17 is a sectional view of the two-stage developing solution supply nozzle.

The developing solution supply nozzle of the present invention is able to have a plurality of solution storages which are stacked each other. As shown in FIG. 17, the supply nozzle may be, e.g., a two-stage developing solution supply nozzle 36" in which a first-stage solution storage 37' is connected to a second-stage solution storage 37" via a connecting pipe 200. The upper surfaces of the first- and second-stage solution storages 37' and 37" are constituted by inclined surfaces 45' and 46' and inclined surfaces 45" and 46", respectively, as in the first embodiment shown in FIG. 1. The highest portions between the inclined surfaces 45' and 46' and between the inclined surfaces 45" and 46" have exhaust ports 50' and 50", respectively. Guide members 55' and 55" are formed below the opening positions of a supply passage 38' and the connecting pipe 200 in the first- and second-stage solution storages 37' and 37", respectively. The lower surfaces of the guide members 55' and 55" are constituted by inclined surfaces 55a and 55b each having a low central portion and two high end portions. The connecting pipes 200 are disposed below the opening positions of a plurality of (e.g., three) supply passages 38'.

In this multi-stage developing solution supply nozzle 36", bubbles mainly consisting of relatively large bubbles are removed by the first-stage solution storage 37'. The bubbles left in the developing solution supplied from the first-stage solution storage 37' to the second-stage solution storage 37" via the connecting pipe 200 are moved by the second-stage solution storage 37". As a result, as compared with the single-stage developing solution supply nozzle 36 shown in FIG. 6, fine bubbles can be more precisely removed to cope with high-precision developing process. In this embodiment, two solution storages are stacked, but the number of solution storages to be stacked on each other may be three or more.

Figure 18:
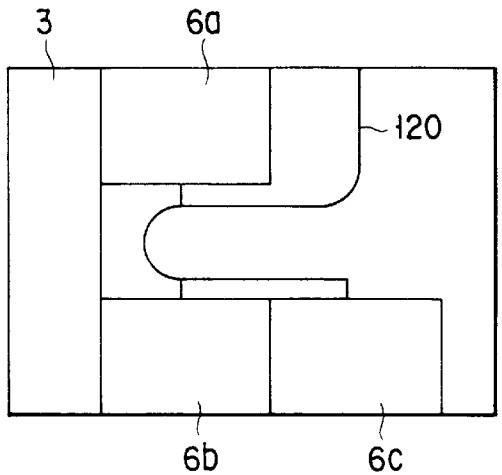
FIG. 18 is a view for explaining a conventional drain line in a resist processing system.
Figure 20:
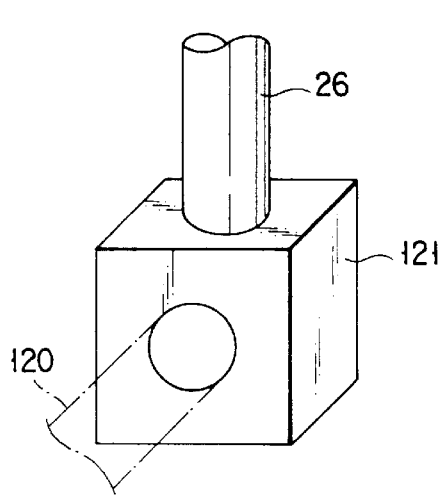
FIG. 20 is a perspective view of a conventional manifold in the resist processing system.

One embodiment of the present invention has been described above by taking a developing apparatus as an example. However, the present invention is not limited to this embodiment and can take various modifications. FIGS. 19 and 21 are related to improvements of a drain line for flowing waste solutions discharged from solution discharge pipes (26 in FIG. 2) of developing apparatuses 6a, 6b, and 6c. That is, as shown in FIG. 18, in a drain line generally used in conventional systems, waste solutions discharged from the solution discharge pipes 25 of the developing apparatuses 6a, 6b, and 6c are collected to a single drain pipe 120 and disposed. In this system, as shown in FIG. 20, a manifold 121 is provided at the lower end of the solution discharge pipe 26 of each of the developing apparatuses 6a, 6b, and 6c. This manifold 121 disposes of a waste developing solution discharged from the solution discharge pipe 26 to the drain pipe 120.

Unfortunately, in this method of disposing of solutions by collecting them to a single drain pipe 120, the number of relay points is increased, and the drain pipe must be routed below the developing apparatuses 6a, 6b, and 6c, increasing the length of the drain pipe. This may interfere with a smooth flow of a waste developing solution. Also, the manifold 121 generally used in conventional systems is relatively long in a horizontal direction. This makes it difficult to connect the drain pipe 120 to a high position. Additionally, the inclination of the drain pipe 120 is nearly horizontal because the drain pipe 120 is long. This further deteriorates the flow of a waste developing solution.

As shown in FIG. 19, therefore, separate drain pipes 122, 123, and 124 preferably dispose of waste solutions discharged from the solution discharge pipes (26 in FIG. 2) of the developing apparatuses 6a, 6b, and 6c to the outside of the system. This decreases the number of relay points and the length of the drain pipes and therefore allows a smooth disposal of a waste developing solution. It is also preferable to attach a comparatively vertically long manifold 125 as shown in FIG. 21 to the lower end of the solution discharge pipe 26 of each of the developing apparatuses 6a, 6b, and 6c. With this manifold 125, the drain pipe 120 can be readily connected to a high position. This makes the inclination of the drain pipe 120 relatively large and allows a smooth flow of a waste developing solution.

In any of the embodiments described above, a developing solution is supplied onto the surface of a resist film formed on a substrate for applying a developing treatment to the resist film. However, the present invention is not limited to these embodiments. To be more specific, the technical idea of the present invention can be applied to any types of processing apparatuses and processing methods, in which a processing solution is supplied onto a surface of the substrate for applying some treatment to a film formed on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A processing apparatus comprising:
   a processing unit for containing a substrate;
   a processing solution supply nozzle arranged above the substrate;
   a processing solution storage formed inside said supply nozzle and having an upper surface consisting of at least one inclined surface;
   a supply passage for supplying a solution into said solution storage;
   a plurality of eject holes formed in a lower surface of said supply nozzle to eject the processing solution in said solution storage; and
   an exhaust port formed in a high portion of said inclined surface of said solution storage.

2. An apparatus according to claim 1, further comprising a guide member formed in said solution storage to disperse a flow of the processing solution supplied from said supply passage into said solution storage.

3. An apparatus according to claim 1, wherein a surface of said guide member opposing said eject holes is low in a central portion thereof and high in two end portions thereof.

4. An apparatus according to claim 2, wherein a surface of said guide member opposing said eject holes is inclined upward from a central portion thereof to two end portions thereof.

5. An apparatus according to claim 1, wherein said supply nozzle has a length not less than a width of the substrate, and comprising a moving mechanism for relatively moving said supply nozzle and the substrate in a direction perpendicular to a widthwise direction of said supply nozzle.

6. An apparatus according to claim 5, wherein said supply nozzle is one of a shower head and a slit nozzle.

7. An apparatus according to claim 1, wherein a sectional shape of said inclined surface of said solution storage is a substantially inverted V shape.

8. An apparatus according to any one of claims 2 to 4, wherein a sectional shape of the surface of said guide member opposing said eject holes is a substantially inverted V shape.

9. An apparatus according to claim 1, wherein said supply nozzle comprises at least two solution storages stacked on each other.

10. An apparatus according to claim 1, wherein exhaust means for exhausting air from said solution storage is connected to said exhaust port.

11. An apparatus according to claim 10, wherein said exhaust means comprises an exhaust pipe connected to the exhaust port and a suction pump connected to said exhaust pipe.

12. An apparatus according to claim 11, wherein the exhaust port comprises a plurality of exhaust ports, and a plurality of exhaust pipes respectively connected to the plurality of exhaust ports merge near said supply nozzle and are connected to said suction pump.

13. A processing apparatus comprising:

a processing unit for storing a substrate;

a processing solution supply nozzle arranged above the substrate;

a processing solution storage formed inside said supply nozzle;

a supply passage for supplying a processing solution into said solution storage;

a plurality of eject holes formed in a lower surface of said supply nozzle to eject the processing solution in said solution storage;

an exhaust port for exhausting air from said solution storage to the outside; and a guide member for dispersing a flow of the processing solution supplied from said supply passage into said solution storage.

14. An apparatus according to claim 13, wherein a surface of said guide member opposing said eject holes is low in a central portion thereof and high in two end portions thereof.

15. An apparatus according to claim 13, wherein a surface of said guide member opposing said eject holes is inclined upward from a central portion thereof to two end portions thereof.

16. An apparatus according to claim 13, wherein said supply nozzle has a length not less than a width of the substrate, and comprising a moving mechanism for relatively moving said supply nozzle and the substrate in a direction perpendicular to a widthwise direction of said supply nozzle.

17. An apparatus according to claim 16, wherein said supply nozzle is one of a shower head and a slit nozzle.

18. An apparatus according to any one of claims 13 to 15, wherein a sectional shape of said inclined surface of said solution storage is a substantially inverted V shape.

19. An apparatus according to claim 13, wherein said supply nozzle comprises at least two solution storages stacked on each other.

20. An apparatus according to claim 13, wherein exhaust means for exhausting air from said solution storage is connected to said exhaust port.

21. An apparatus according to claim 20, wherein said exhaust means comprises an exhaust pipe connected to the exhaust port and a suction pump connected to said exhaust pipe.

22. An apparatus according to claim 21, wherein the exhaust port comprises a plurality of exhaust ports, and a plurality of exhaust pipes respectively connected to the plurality of exhaust ports merge near said supply nozzle and are connected to said suction pump.

23. An apparatus according to claim 13, wherein an upper surface of said solution storage comprises at least one inclined surface.

24. An apparatus according to claim 23, wherein a sectional shape of said inclined surface of said solution storage is a substantially inverted V shape.

25. An apparatus according to claim 13, wherein said exhaust port is formed in a high portion of said inclined surface of said solution storage.

26. A processing method of processing a substrate by supplying a processing solution to a surface of the substrate, comprising the steps of:

supplying the processing solution to a solution storage formed in a supply nozzle and ejecting the processing solution in said solution storage from a plurality of eject holes formed in a lower surface of said supply nozzle, thereby supplying the processing solution on a surface of a substrate; and exhausting air from said solution storage through an exhaust port formed in said supply nozzle.

27. A method according to claim 26, wherein air is exhausted from said solution storage while the processing solution is supplied to the surface of the substrate.

28. A method according to claim 26 or 27, wherein air is exhausted from said solution storage before the processing solution is supplied to the surface of the substrate.

29. A method according to claim 26 or 27, wherein air is exhausted from said solution storage after the processing solution is supplied to the surface of the substrate a plurality of times.

30. A method according to claim 26 or 27, wherein air is exhausted from said solution storage after the processing solution is supplied to one lot of a plurality of substrates.

* * * * *